United States Patent
Ferguson et al.

(10) Patent No.: US 9,690,893 B1
(45) Date of Patent: Jun. 27, 2017

(54) METHODS AND SYSTEMS FOR CUSTOMIZABLE EDITING OF COMPLETED CHAIN OF ABUTTED INSTANCES

(71) Applicant: CADENCE DESIGN SYSTEMS, INC., San Jose, CA (US)

(72) Inventors: Kenneth Ferguson, Edinburgh Scotland (GB); Gilles S. C. Lamant, Sunnyvale, CA (US); Min-Ching Lin, Zhubei (TW); David J. Mallon, Aberdour (GB)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/863,985

(22) Filed: Sep. 24, 2015

(51) Int. Cl.
*G06F 17/50* (2006.01)

(52) U.S. Cl.
CPC ...... *G06F 17/5072* (2013.01); *G06F 17/5081* (2013.01)

(58) Field of Classification Search
CPC ............ G06F 17/5072; G06F 17/5068; G06F 17/5081; G06F 17/5036; G06F 17/505; G06F 17/5077; G06F 2217/78; G06F 2217/82

See application file for complete search history.

(56) References Cited

U.S. PATENT DOCUMENTS

| | | | | |
|---|---|---|---|---|
| 8,046,730 B1* | 10/2011 | Ferguson | ............ | G06F 17/5068 716/100 |
| 8,694,941 B1* | 4/2014 | Badel | ................. | G06F 17/5072 716/122 |
| 8,707,226 B2* | 4/2014 | Lu | ...................... | G06F 17/5068 716/104 |
| 8,719,754 B1* | 5/2014 | Ginetti | ................ | G06F 17/5072 716/119 |
| 9,122,834 B1* | 9/2015 | Caluya | ................ | G06F 17/5081 |
| 9,213,791 B1* | 12/2015 | Yadav | ................. | G06F 17/5072 |
| 9,348,963 B1* | 5/2016 | Lin | ..................... | G06F 17/5077 |
| 2007/0118825 A1* | 5/2007 | Gaul | ................... | G06F 17/5068 716/55 |
| 2010/0153892 A1* | 6/2010 | Gray | ................... | G06F 17/5068 716/103 |
| 2011/0061034 A1* | 3/2011 | Ginetti | ................ | G06F 17/5068 716/104 |
| 2014/0258952 A1* | 9/2014 | Yang | ................... | G06F 17/5081 716/112 |
| 2015/0067624 A1* | 3/2015 | Tam | .................... | G06F 17/5081 716/111 |

* cited by examiner

*Primary Examiner* — Nha Nguyen
(74) *Attorney, Agent, or Firm* — Eric L. Sophir; Dentons US LLP

(57) ABSTRACT

Methods and systems of an electronic circuit design system described herein provide a new abutment tool in which a chain post-processing function is called once per resultant chain of abutted instances after each chain is fully formed in a layout. In an embodiment, a process design kit (PDK) abutment update function is enhanced to support a new chain processing event that facilitates a creation of new top level figures in a cell view in which the chain lives, and further facilitate adjustment of parameters of instances of programmable cells in the chain.

20 Claims, 6 Drawing Sheets

METHODS AND SYSTEMS FOR CUSTOMIZABLE EDITING OF COMPLETED CHAIN OF ABUTTED INSTANCES

TECHNICAL FIELD

This application relates generally to the field of electronic circuit design, and more specifically methods and systems for customizable automated editing of completed chains of abutted circuitry represented within the design.

BACKGROUND

A semiconductor integrated circuit (IC) has a large number of components, such as transistors, logic gates, and diodes that are fabricated by forming layers of different materials and different geometric shapes on various regions of a silicon wafer. The large number of components in the IC may be facilitated with an Electronic Design Automation (EDA) tool that allows a semiconductor designer to position and connect various shapes on the IC. The semiconductor designers create a custom design of such ICs, printed-circuit boards, and other electronic circuits containing the physical locations and dimensions of the circuit's components, interconnections, and various layers from the original design that may then be fabricated using EDA technologies that typically run on an operating system in conjunction with a microprocessor-based computer system or other programmable control system.

As part of the IC design, the collections of various shapes forming features or devices are inserted into the circuit design as cells. The EDA tools facilitate breaking a complex circuit design into small sub-designs that include the cells. These cells can be instantiated as instances inside other cells, thus enabling hierarchical design and re-use when the same cell is instantiated more than one time. The cells implement logic or other predefined functions using various integration technologies. Typically, programmable cells, also known as parameterized cells (pcells), have been used in designing circuits. The EDA tools facilitate generation of the pcells, which are a type of cell for which various parameters of their circuit components can be specified. The EDA tools may facilitate automatic generation of the pcells by the FDA tool based on the values of its parameters. The source code of the pcells is executed by the EDA tool that uses modified or default parameter values to generate a customized instance of the pcells. Also, the pcells are more flexible than a conventional cell because the different instances of the pcells may have different parameter values.

Conventional layout tools provide a customizable abutment process for the pcells. The abutment process provides the functionality to abut instances of the pcell views resulting in a chain of abutted instances which form a compact layout. In order to initiate abutment, the semiconductor designer overlaps a set of instances of the pcell with another set of instances of the pcell. The layout tool detects the overlap of abuttable instances and automatically runs a process design kit (PDK) defined abutment function associated with those overlapping pcells. Alternatively, the semiconductor designer selects a set of instances of the pcell that might not currently be overlapping and then invokes a specific layout editor command requesting that instances be abutted together to form an abutted chain. An abutment updating function then updates the instances parameters for the pcell and re-evaluates those parameters to create a new pcell sub-master that takes the abutment into account along with the overlap margin. The abutment updating function is provided as part of the PDK together with the pcells, and similar to the pcells, the abutment updating function is also written in an extension language.

In the conventional abutment tools, the tool will only abut a successive pair at one time until obtaining a chain of abutted instances. Because the abutment tool available today only abuts a pair of instances at any given point in time, there is no context of the full chain in which those instances actually reside or are changed. As the processes are becoming more advanced and with the increasingly complex design rules in todays advanced processes, the context of where the instances are within the chain as a whole is becoming more important. For example, simulation parameters are set based on where the instances are within the chain. In situation having a transistor instance of the pcell in the middle of the chain, then some of simulation parameters of the transistor instance depend on how far it is from a left end and a right end of the chain, and/or a top end of the chain and a bottom end of the chain.

In one exemplary scenario, there are four selected instances for abutment where the left most instance is called I1 followed by I2, I3, and I4. With a conventional abutment tool, the abutment tool will initially abut I1 and I2, and the abutment tool will assume that chain is going to be the final chain. Accordingly, the abutment tool will compute new parameters and geometries assuming that the final chain was created. Later, the third instance I3 is abutted into the chain (of I1 and I2) by the tool. At this time, the abutment tool traverses back along the created chain (of I1 and I2) and discovers that the assumptions made earlier on the created chain (of I1 and I2) are actually not correct. This will lead to deletion of the geometries and/or adjustment of the parameters for the back of the created chain (of I1 and I2). Similarly, when the final instance I4 is abutted, the abutment tool would again modify the parameter values as well as the geometries as the abutment tool will discover that I3 is now no longer the end of the created chain (of I1, I2, and I3).

Therefore, using the existing abutment tools, it is not possible to generate a correct layout at the time each pair of instances are abutted, because some features of the layout can only be created when more instances in the chain have been abutted, and all the instances in the chain are correctly positioned relative to each other. Further, the parameters of the instances in the chain for simulation can only be configured correctly when the chain is fully formed. Therefore, there is a need in the art for methods and systems that addresses the above mentioned drawbacks of conventional techniques employed in abutment of pcell instances.

SUMMARY

Methods and systems disclosed herein attempt to address the above issues and may provide a number of other benefits as well. Methods and systems of an electronic circuit design system described herein provide a new abutment tool in which a new chain post-processing event supported by a process design kit (PDK) customizable abutment function is called after each chain of the plurality of instances is fully formed in a design layout, and thereby solves the above mentioned drawbacks of the conventional abutment techniques being employed. The new chain post-processing event facilitates creation of new top-level figures in a cell view in which the chain of instances are instantiated, and further facilitates adjustment of parameters of instances of a programmable cell (pcell) in the chain. In addition to being called in a conventional manner each time a pair of instances of the plurality of instances are abutted or un-abutted, an EDA tool additionally calls an abutment updating function one time for each new chain that results from a last editing command run in a layout editor. In the final call to the abutment updating function, the EDA tool passes in an argument which allows the abutment updating function to identify which chain it is being called to post-process. Other embodiments of the present disclosure may choose to implement a chain post-processing function as a separate callable customizable function from the PDK customizable abutment function that is used to perform the other phases of the abutment process.

In one embodiment, a system comprises a non-transitory machine-readable memory unit to store one or more identification rules. The system further comprises a control unit having a processor configured to identify a plurality of instances of one or more pcells for an abutment process based on the one or more identification rules, initiate the abutment process of the plurality of instances of the one or more pcells to form one or more abutted chains of the plurality of instances, and trigger a post-processing of the plurality of instances of the one or more pcells in the one or more abutted chains.

In another embodiment, a processor-implemented method comprises identifying, by a processor, a plurality of instances of one or more pcells for an abutment process based on one or more identification rules. The processor-implemented method further comprises abutting, by the processor, the plurality of instances of the one or more pcells to form one or more abutted chains of the plurality of instances. The processor-implemented method further comprises triggering, by the processor, a post-processing of the plurality of instances of the one or more pcells in the one or more abutted chains.

In one embodiment, a system comprises a non-transitory machine-readable memory unit to store one or more identification rules. The system further comprises a control unit having a processor configured to identify a plurality of instances of one or more pcells for an abutment process based on the one or more identification rules, initiate the abutment process of the plurality of instances of the one or more pcells to form one or more abutted chains of the plurality of instances, and generate a new chain event after the forming of the one or more abutted chains of the plurality of instances to allow post-processing of the one or more abutted chains of the plurality of instances. On receiving an instruction to un-abut at least one instance from the one or more abutted chains of the plurality of instances, the control unit is further configured to un-abut the at least one instance from the one or more abutted chains of the plurality of instances of the one or more pcells to form two or more new chains and generate the new chain event by initiating a PDK customizable abutment updating function one time per each resulting new chain after forming the two or more new chains to allow post-processing of the remaining plurality of instances of the one or more pcells in the two or more new chains.

In another embodiment, a processor-implemented method comprises identifying, by a processor, a plurality of instances of one or more pcells for an abutment process based on one or more identification rules. The processor-implemented method further comprises abutting, by the processor, the plurality of instances of the one or more pcells to form one or more abutted chains of the plurality of instances. The processor-implemented method further comprises generating, by the processor, a new chain event after forming the one or more abutted chains of the plurality of instances to allow post-processing of the plurality of instances of the one or more pcells in the one or more abutted chains. The processor-implemented method further comprises receiving, by the processor, an instruction to un-abut at least one instance from the one or more abutted chains of the plurality of instances of the one or more pcells. The processor-implemented method further comprises un-abutting, by the processor, the at least one instance from the one or more abutted chains of the plurality of instances of the one or more pcells to form two or more new chains. The processor-implemented method further comprises generating, by the processor, the new chain event by initiating a PDK customizable abutment updating function one time per each resulting new chain after forming the two or more chains, to allow post-processing of the remaining plurality of instances of the one or more pcells in the two or more new chains.

It is to be understood that both the foregoing general description and the following detailed description are exemplary and explanatory and are intended to provide further explanation of the invention as claimed.

BRIEF DESCRIPTION OF THE DRAWINGS

The accompanying drawings constitute a part of this specification and illustrate an embodiment of the invention and together with the specification, explain the invention.

DETAILED DESCRIPTION

Figure 1:
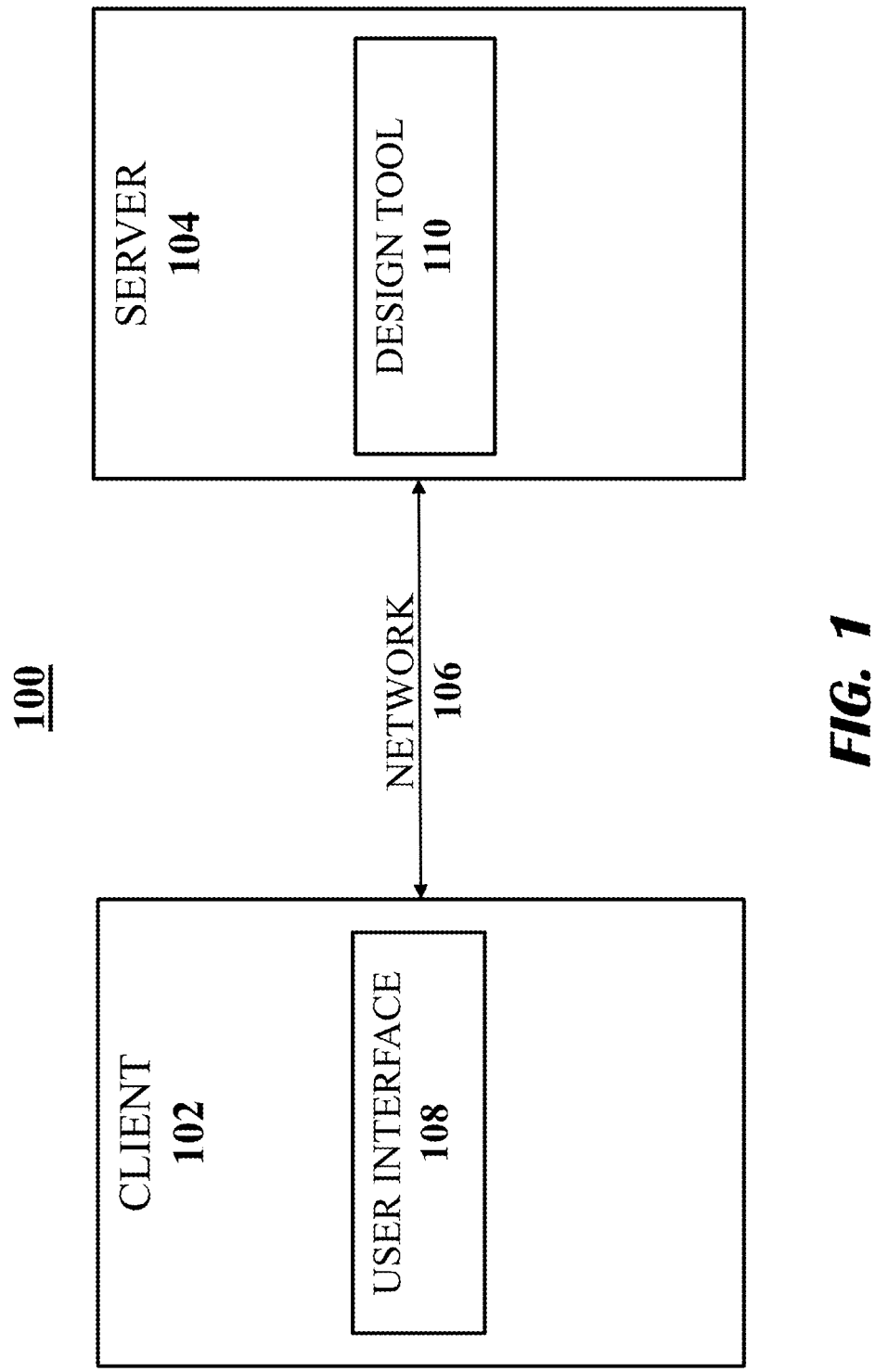
FIG. 1 illustrates an electronic design automation system, according to an exemplary embodiment.

Reference will now be made to the illustrative embodiments illustrated in the drawings, and specific language will be used here to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention. The present disclosure is here described in detail with reference to embodiments illustrated in the drawings, which form a part here. Other embodiments may be used and/or other changes may be made without departing from the spirit or scope of the present disclosure. The illustrative embodiments described in the detailed description are not meant to be limiting of the subject matter presented here.

Embodiments herein recite an improved method and system of abutting a plurality of instances of a programmable cell or parameterized cell (pcell) of an electronic circuit design. The embodiments of the present disclosure may be implemented in electronic design automation (EDA) technologies, such as a custom integrated circuit (IC) design system having a graphic user interface or layout editor running program code to assist a circuit designer to generate and implement customized electronic circuit designs. Although the present disclosure can be implemented to run with custom design systems, it is understood that the present disclosure is not limited thereto and may also be implemented with other known or later developed EDA technologies or hardware description languages capable of generating and manipulating the pcell and instances of the pcell to create and produce electronic layout designs. The present disclosure is illustrated herein by way of examples with respect to pcells, however, it is to be noted that the present disclosure is applicable to any types of programmable or parameterized cells and as such is not limited to the pcells.

The pcell has content that can be dynamically created based on a set of parameters. The main attributes of the pcell are a piece of code in a given language, a list of parameter types, and a default value. The language and evaluator of the pcell is implemented in a programming language such as SKILL, TCL, or Python languages. A pcell instance is an instance of the pcell, for example, an instance having the pcell parameter values. The evaluation of the pcell instance means evaluating the pcell code against the instance parameters in order to produce a new non-persistent design with real data. This new design is referred to herein as a sub-master. Therefore, the pcell sub-master is the pcell variant that contains the results of the evaluation of the pcell implementation function against pcell instance parameter values.

The pcells also reduce design entry time and design rule violations while providing an accelerated level of design automation to minimize tedious and repetitive layout tasks. The pcells may be used to support the ability of the circuit designers to change the size, shape, or contents of each cell instance without changing or losing the original cell content. By lowering to the component level of the design, the pcells simplify the manner in which complex shapes and devices can be generated, edited, and managed with variable settings, thereby accelerating layout tasks and reducing design violations.

FIG. 1 illustrates an electronic design automation system 100, according to an exemplary embodiment. The electronic design automation system 100 includes a client 102 and a server 104. The client 102 is connected to the server 104 via a network 106. The network 106 refers to a medium that also connects various computing devices and database of the system 100. Examples of the network 106 include, but are not limited to, LAN, WLAN, MAN, WAN, and the Internet. The communication over the network 106 may be performed in accordance with various communication protocols such as Transmission Control Protocol and Internet Protocol (TCP/IP), User Datagram Protocol (UDP), and IEEE communication protocols.

The client 102 may any computing device, and has a user interface 108. The computing device refers to a computer with a processor/microcontroller and/or any other electronic component that performs one or more operations according to one or more programming instructions. The examples of the computing device include, but are not limited to, a desktop computer, a laptop, a personal digital assistant (PDA), a tablet computer, and the like. The computing device is capable of communicating with the server 104 through the network 106 using wired or wireless communication capabilities.

The client 102 facilitates a circuit designer accessing a memory device (not shown) in the server 104. The memory device, for example, stores electronic design layouts and pattern libraries. In an embodiment, layout rules for the layouts are derived from design rules of a fabrication process. The layout rules include limitations on the design features that require adjustments to the features and shapes. In one example, the layout rules may include rules for the sizing and spacing of features such that compliance with the rules may require the addition, removal, or resizing of shapes. Additionally, the neighboring features near a pair of abutted features may be analyzed to determine which shapes should be added or removed, and which shapes should remain and be abutted. These layout rules may be encoded as part of an abutment process, and may be defined using the SKILL language, for example.

The server 104 is a network server accessible to the client 102 via the network 106. The user interface 108 may receive instructions regarding a layout design from the circuit designer, and utilizes the optimization procedures stored in the memory device to facilitate optimization of the layout design and the execution of an abutment process. The server 104 further has a design tool 110. The design tool 110 may have access to the memory device (e.g., store data, update data, query data, retrieve data), and may be configured to facilitate the analysis of the design layout to identify features for abutment and perform the abutment procedures described herein. The circuit designer may interact with the design tool 110 through a number of input devices such as by inputting a selection as with a mouse or inputting a request as with a keyboard. The circuit designer may observe the response to the access request on an output device or display. The design tool 110 may run in an application window controlled by the circuit designer.

In another embodiment, the client 102 may execute a design tool and may also have access to a memory device. The client 102 may be any computing system that executes the design tool or otherwise facilitates access to the memory device storing layouts and pattern libraries. In yet another embodiment, multiple different clients may access the memory device via the network 106 and request access to the objects stored therein.

Figure 2:
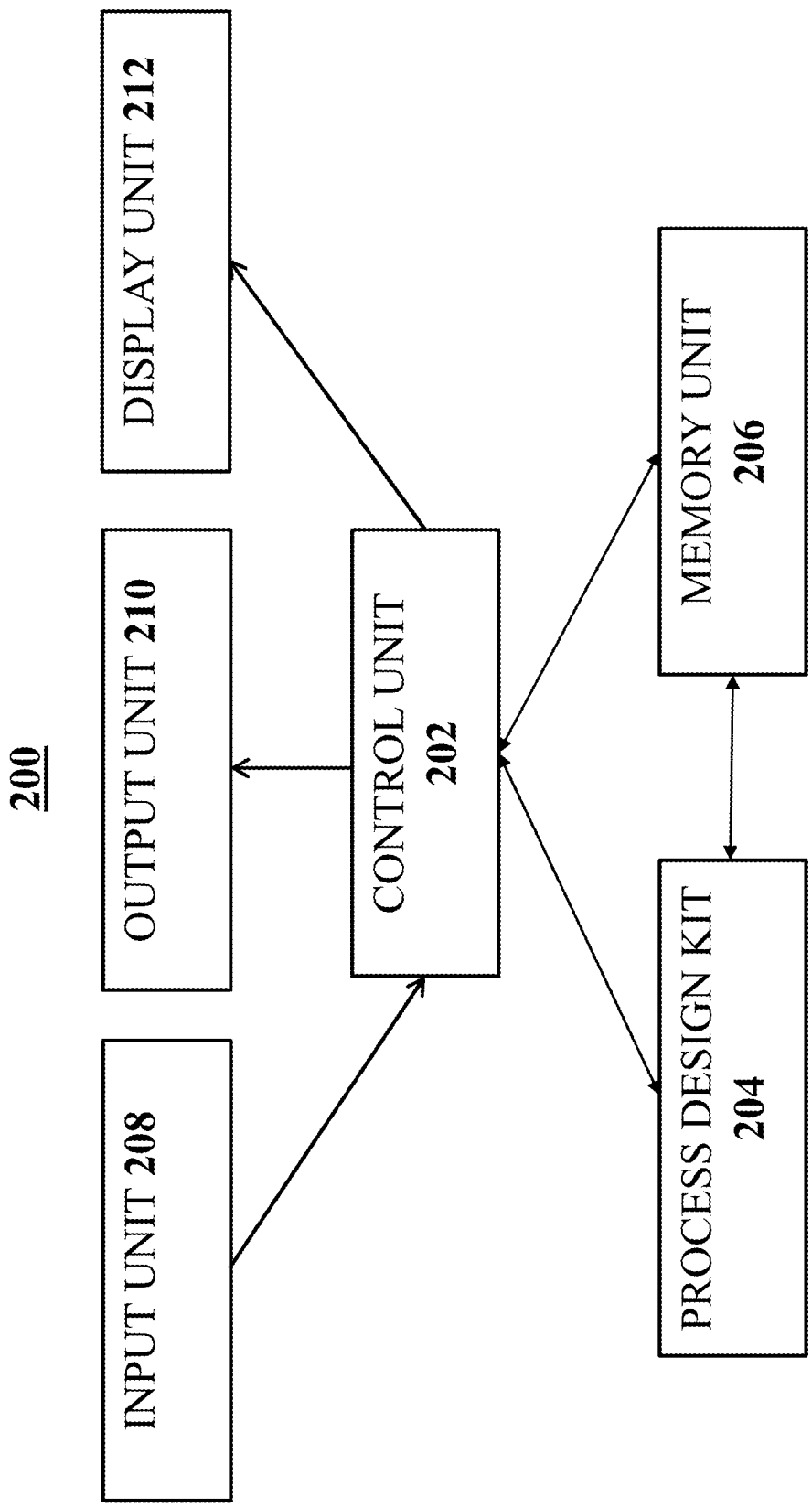
FIG. 2 is a block diagram depicting components of an electronic design automation system, according to an exemplary embodiment.

FIG. 2 is a block diagram depicting components of an electronic design automation system 200, according to an exemplary embodiment. The system 200 includes a control unit 202, a process design kit (PDK) 204, a memory unit 206, an input unit 208, an output unit 210, and a display unit 212. In one implementation, all the components of system 200 may be connected via an interconnect bus. In another implementation, the control unit 202 and the memory unit 206 may be connected via a local microprocessor bus, and the remaining units of the system 200 may be connected via one or more input/output buses.

The control unit 202 implements a processor/microprocessor system to control the operations of the system 200. The control unit 202 may include a single processor or a plurality of processor for configuring the system 200 as a multi-processor system. The processor includes suitable logic, circuitry, and interfaces that are operable to execute one or more instructions to perform predetermined operations/tasks. The processor can be realized through a number of processor technologies known in the art. The examples of the processor include, but are not limited to, an x86 processor, an ARM processor, a Reduced Instruction Set Computing (RISC) processor, an Application-Specific Integrated Circuit (ASIC) processor, or a Complex Instruction Set Computing (CISC) processor. The processor may also include a Graphics Processing Unit (GPU) that executes the set of instructions to perform one or more processing operations. The processor may further include a software-based graphic design environment executing software programs to assist the user in generating and streamlining layout designs.

The PDK 204 contains information specific to a particular design task (such as abutment functions) and other tasks including libraries of symbols, views, pcells, and technology files provided in suitable file formats. The PDK 204 has an interface interconnected with the control unit 202 to enable a circuit designer to access cell level design solutions and optimize layout designs interactively via the input unit 208 and the display unit 212. The assortment of libraries of the PDK 204 can be collections of one or more circuit designs stored in digital formats, and may be accessible by the control unit 202. The circuit design may be any circuit design that includes digital logic elements. The examples of digital logic elements include AND gates, OR gates, NOT gates, NOR gates, NAND gates, XOR gates, XNOR gates, and/or combinational logic circuits, such as flip-flops, shift-registers, multiplexers and de-multiplexers. The examples of the electronic circuit design include a microcontroller unit (MCU), system-on-chip (SOC), and application specific integrated circuit (ASIC) design. The digital content of the library may be stored locally, or accessed remotely via a computer network.

The memory unit 206 is a non-volatile storage device for storing data and instructions, to be used by the control unit 202. The memory unit 206 is implemented with a magnetic disk drive, an optical disk drive, a solid state device, or an attachment to a network storage. The memory unit 206 may comprise one or more memory devices to facilitate storage and manipulation of program code, set of instructions, tasks, data, PDKs, and the like. Non-limiting examples of memory unit 206 implementations may include, but are not limited to, a random access memory (RAM), a read only memory (ROM), a hard disk drive (HDD), a secure digital (SD) card, a magneto-resistive read/write memory, an optical read/write memory, a cache memory, or a magnetic read/write memory. Further, the memory unit 206 includes one or more instructions that are executable by the processor of the control unit 202 to perform specific operations. The support circuits for the processor include conventional cache, power supplies, clock circuits, data registers, I/O interfaces, and the like. The I/O interface may be directly coupled to the memory unit 206 or coupled through the processor of the control unit 202.

An input unit 208 may be a keyboard, mouse, pointer, or other input generating device to facilitate input of control instructions by the circuit designer to the control unit 202. In one embodiment, the input unit 208 provides a portion of the user interface for the system 200, and may include an alphanumeric keypad for inputting alphanumeric and other key information along with a cursor control device such as a mouse, a trackpad or stylus. An output unit 210 of the system 200 facilitates physical implementation of a circuit designers' custom designs by providing a direct link to manufacturing processes at a silicon level or a chip level. A display unit 212 of the system 200 may include a cathode ray tube (CRT) display, liquid crystal display (LCD), plasma, or light emitting diode (LED) display. A graphics subsystem may receive textual and graphical information and process the information for output to the display unit 212.

In one embodiment, the pcells provided with the PDK 204 may be accessed by the circuit designer by way of a graphical user interface or layout editor visualized by the display unit 212. The display unit 212 may also visualize a graphical user interface or layout editor having a design mode and an edit mode to enable generation an editing of custom electronic circuit designs.

Figure 3:
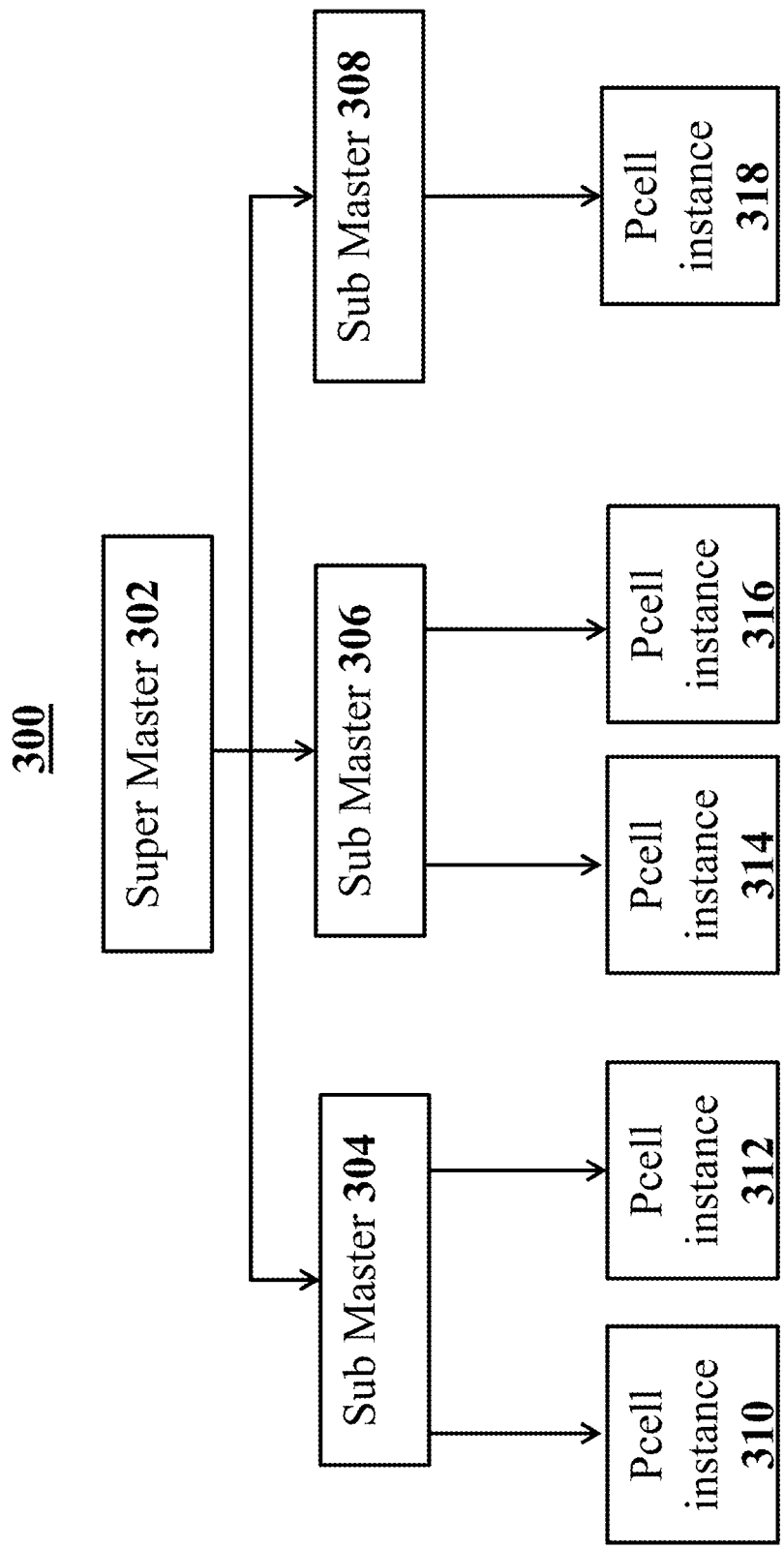
FIG. 3 illustrates a hierarchical structure of a pcell, according to an exemplary embodiment.

FIG. 3 illustrates a hierarchical structure of a pcell, according to an exemplary embodiment. In an embodiment, a cell may be a record of a particular transistor capable of being logically placed onto a circuit design, where the cell contains various types of information useful for designing the circuit design, such as transistor dimensions. A pcell is a programmable cell that allows creation of a customized instance of the pcell each time it is placed or used in design. The pcell is more flexible as compared to other cells representing circuitry because different instances of the pcell may have different parameter values, whereas other cells may be more static; particularly parameter values associated with the physical dimensions of the transistors. For example, with a transistor pcell, parameter values such as the length, width, number of gate segments, and/or other design elements of the transistor, can be realized by simply inserting or changing one or more parameter values. Therefore, rather than have many different cell definitions to represent the variously sized transistors in a given design, a single pcell may take a transistor's dimensions such as length and width as parameters. The different instances of the single pcell can then represent transistors of different sizes but otherwise having similar characteristics. In an embodiment, the pcell can exist at three different levels, namely, super master 302; sub master 304, 306, 308; and pcell instance 310, 312, 314, 316, 318. As embodied and illustrated in FIG. 3, the pcell super master 302 component is illustrated at the top, with each of the different pcell sub master(s) 304, 306, 308 representing different pcell instances 310, 312, 314, 316, 318 of the pcell used by a circuit designer. It also should be appreciated that the circuit designer can create any number of super masters, sub masters, and instances in any given pcell.

The pcell supermaster 302 is a type of the pcell that is encoded in a computer readable device and that is associated with a list of parameters, parameter types, parameter default values and with logic in the form of computer program code. The circuit designer specifies parameter values of its parameters for the pcell super master 302. In one embodiment, an automated design tool uses the logic of the pcell super master 302 to generate one or more cells referred to as the pcell sub masters 304, 306, 308 that complies with the user-specified parameter values. In a typical session of an automated design tool usage, all regular cell instances of the same pcell super master 302 that share the same parameter values typically also will share the same pcell sub masters 304, 306, 308. Thus, instances of a regular cell within a design may be copies of the pcell sub masters 304, 306, 308.

The pcell sub master(s) 304, 306, 308 is created by evaluating pcell code associated with the pcell super master 302 for a given unique set of parameter values. The pcell sub masters 304, 306, 308 are created in-memory such as volatile memory on demand for each unique set of parameters associated with instances in the open design. The pcell sub master(s) 304, 306, 308 which receives properties from the associated pcell super master 302 typically resides in virtual memory and not disk, and contains unique geometries produced by a unique set of parameter values. In one embodiment, the new pcell sub master(s) 304, 306, 308 can be created without evaluating the pcell code and by editing the existing pcell sub master(s) 304, 306, 308 and then binding the new pcell sub master(s) 304, 306, 308 to selected instances of the original pcell sub master(s) 304, 306, 308.

In such a case, the circuit designer can make manual edits of the pcell sub master(s) 304, 306, 308 content by hand through the graphical user interface. In another embodiment, the edits of the pcell sub master(s) 304, 306, 308 content can also be made automatically through a component of the EDA tool or can be made through use of the application programming language of the EDA system. The actual shapes that comprise the pcell sub master(s) 304, 306, 308 are created by a function associated with the pcell usually written in a programming language such as SKILL.

The pcell instance(s) 310, 312, 314, 316, 318 which inherit parameters and content from the associated pcell sub master(s) 304, 306, 308 by means of being bound to that pcell sub master(s) 304, 306, 308 resides in the virtual memory. The pcell instances 310, 312, 314, 316, 318 can be associated with a set of parameter values, and each group of the pcell instances 310, 312, 314, 316, 318 which have the same parameter values all bind to the same pcell sub master(s) 304, 306, 308.

In one embodiment, the circuit designer can use the layout editor to create new pcell sub master 304, 306, 308 content using layout-editing techniques, as applied to an existing pcell supermaster 302. However, it is understood that the circuit designer does not necessarily have to descend from the top level of the layout design in order to make the layout edits, and the circuit designer may invoke the edit (or abut) command on selected instance(s) 310, 312, 314, 316, 318 at the top level, and then directly edit (or abut) the displayed shapes that are inside the pcell sub master(s) 304, 306, 308 while in the context of the top level.

If using an EDA layout platform built on the OpenAccess (OA) database for interoperability support between electronic design tools, though any database may be implemented, OA imposes some changes on the design data such that the design data is more compact and easier to comprehend by multiple design tools. SKILL is the primary language for writing pcells, and with OpenAccess other languages have also become available. The required edits to use the pcells is to update any SKILL which manipulates parameters on the pcell instances. This include abutment and other functions.

Figure 4:
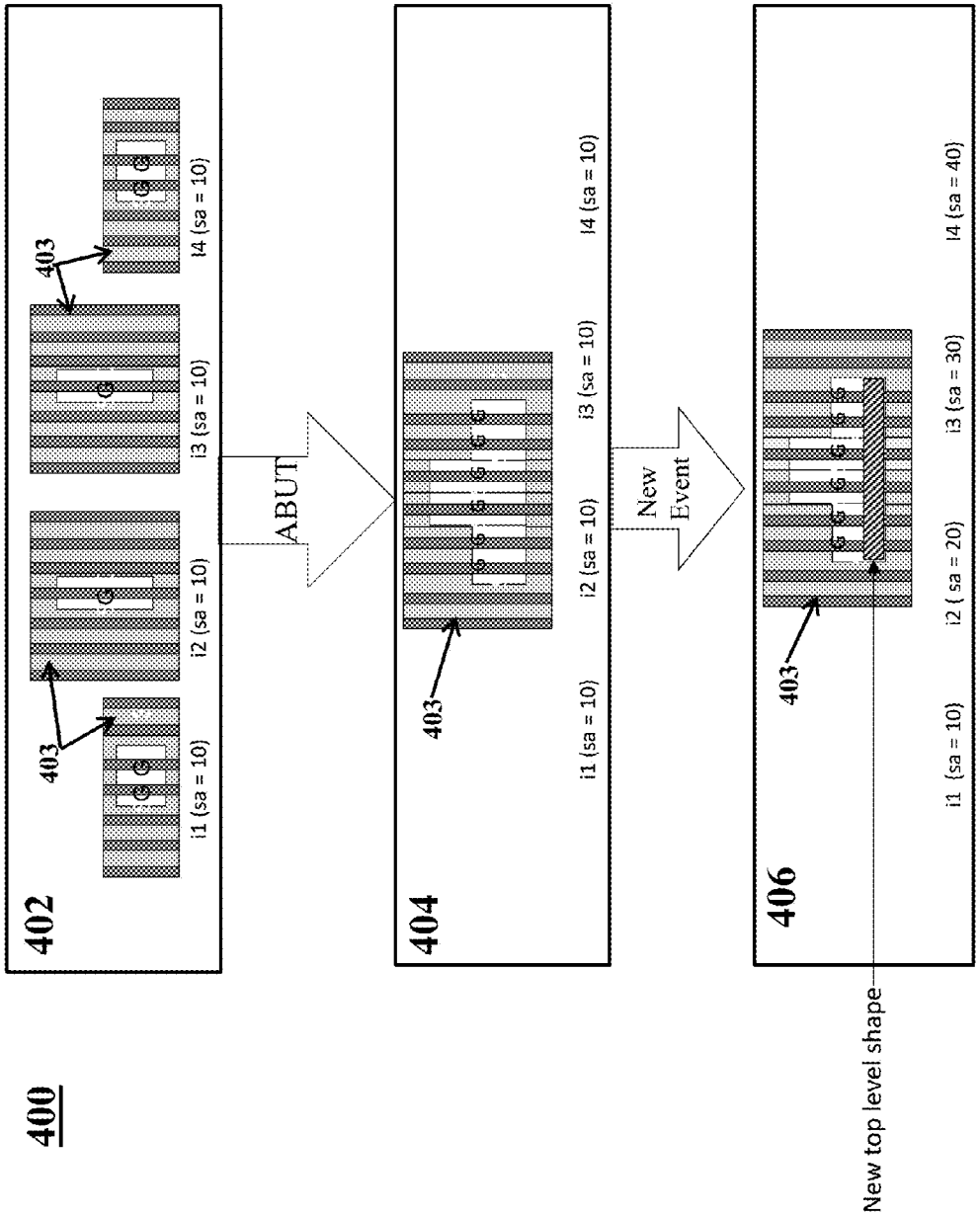
FIG. 4 illustrates abutment process of a plurality of instances of a pcell to form a single new chain, according to an exemplary embodiment.

FIG. 4 illustrates abutment process 400 of a plurality of instances of a pcell to form a single new chain, according to an exemplary embodiment. The abutment process 400 establishes abutment between the plurality of different instances of the pcell connected to a same net on a same circuit design layer.

In one embodiment, the abutment of devices (or transistor instances) allows plural adjacent devices (or transistor instances) to share common constituent elements with one another. The elements may include a diffusion region, a contact, a common drain, a common source, a shared drain, a shared source, or any other element. This serves to reduce required surface area for circuit components and the required routed wire segments for their interconnection within the circuit design to allow more free space for other components. The abutment increases production yields, decreases costs, and facilitates smaller circuit products. In another embodiment, in the abutted relation, the two adjacent devices (or transistor instances) may share one or more of a common interface regions, contacts, drains, or source portions rather than having separate and independent portions with a mandatory offset space maintained there between to comply with design rule constraints.

In order to initiate the abutment process of the plurality of instances of the pcell, the abutment process is triggered. There are several methods of triggering the abutment process of the plurality of instances of the pcell. In one exemplary method of triggering the abutment process of the plurality of instances of the pcell, an interactive abutment method may be implemented for abutting the plurality of instances of the pcell. In the interactive abutment method, if there are two instances (a first instance and a second instance) of the pcell that are not touching each other, a circuit designer moves, using the mouse-clicks in connection with the graphical user interface, one of the first instance of the two instances such that the first instance partially or completely overlaps the second instance of the two instances. The two overlapping instances (the first instance and the second instance) are then called abuttable figures, which are within a current master of the two instances (the first instance and the second instance). In other words, when the circuit designer overlaps two instances (the first instance and the second instance), such that two of a plurality of abuttable figures within their current masters are now overlapping each other, an abutment engine of a control unit detects if there is at least one edge overlap between the first instance and the second instance. Once the detection of the at least one edge being superimposed is determined, the abutment engine of the control unit initiates the abutment of the two instances (the first instance and the second instance).

In another exemplary method of triggering the abutment process of the plurality of instances of the pcell, if there are two or more instances (for example, a first instance and a second instance) that are not touching with each other, the circuit designer select the two or more instances (the first instance and the second instance) using the mouse-clicks in connection with the GUI but does not move the two or more selected instances (the first instance and the second instance) from their position within the design layout. The circuit designer subsequently chains the two or more instances (the first instance and the second instance) together based on the two instances selected by the circuit designer. The chaining engine of the control unit then decides the order of the two or more instances to be abutted, and produces the chain of abutted instances. In one embodiment, the plurality of instances of the pcell may be abutted to form a single abutted chain. In another embodiment, the plurality of the pcell may be abutted to form more than one abutted chain without moving out from the scope of the disclosed embodiments. The abutment process to form one or more abutted chains may be triggered by any of the triggering method described above.

As illustrated in FIG. 4, there are four instances represented as i1, i2, i3, and i4 in stage 402. Each of the four instances i1, i2, i3, and i4 has a simulation parameter value "sa" as 10 (sa=10). A chain may be formed by a number of circuit devices, such as transistors instances i1, i2, i3, and i4, through a representation of circuit components, such as pcells or any other device, responsive to a chained, interconnected, or abutted disposition. In an embodiment, the simulation parameter value is a distance from a polysilicon finger or shape in the instance pcell master to a leftmost end of a continuous region of diffusion associated with the chain of instances. The dummy polysilicon shape 403 refers to shapes added to the instance or between instances i1, i2, i3, and i4 to ensure correct electrical behavior or correct physical fabrication, and/or otherwise support the integrated circuit manufacturing process.

The four instances i1, i2, i3, and i4 are overlapping each other, and are being arranged in abutted relation. The user interface may provide a working space which allows the circuit designer to insert, manipulate, and remove instances and interconnections there between in the circuit design. In one embodiment, the circuit designer may be interactively moving the four instances i1, i2, i3, and i4 such that they are all overlapped, or are partially overlapping to initiate the abutment process. In another embodiment, the circuit designer maybe selecting the four instances i1, i2, i3, and i4, and then the chaining command may be initiated by the circuit designer to invoke the abutment process of the four instances i1, i2, i3, and i4. At stage 404, all the four instances i1, i2, i3, and i4 are abutted together in a sequence to form the chain after the completion of the abutment process by the control unit. The chain of instances in stage 404 includes the instances i1, i2, i3, and i4 that are interconnected by abutment.

During the layout optimization process, the proximity of any two instances among the four instances i1, i2, i3, and i4 in the design may also automatically trigger the abutment process by the control unit according to the applicable layout rules. The instances in proximity may be identified as features having shapes within a predetermined distance. The features may be identified for abutment if two shapes on respective features are may be in close proximity or overlapping each other. In the abutment process, the instances i1, i2, i3, and i4 are then adjusted, resized, realigned, or merged. In the abutment process, one or more dummy polysilicon shapes may also be inserted into the layout or removed from the layout. The one or more dummy polysilicon shapes are inserted into the layout or removed from the layout in order to optimize the physical or electrical behavior of the instances.

In the illustrated FIG. 4, each of the four instances i1, i2, i3, and i4 may include a transistor, net connections, and dummy polysilicon shapes 403 on either side of the gate of the transistor. During the abutment process executed by the control unit, in the illustrated embodiment, a layout rule may require at least one dummy polysilicon shape per transistor in the un-abutted layout. In one example, if the four instances i1, i2, i3, and i4 have dummy polysilicon shapes 403 in close proximity or overlapping, the abutment process executed by the control unit may overlap the adjacent dummy polysilicon shapes 403 or altogether eliminate the dummy polysilicon shapes 403 of the instances i1, i2, i3, and i4. Then the resultant abutment layout of the instances i1, i2, i3, and i4 shown in 404 will include the transistors, net connections, and less number of dummy polysilicon shapes 403. In another example, the abutment process executed by the control unit may eliminate the adjacent dummy polysilicon shapes 403 of the instances i1, i2, i3, and i4 and the interface shapes in each instance of the of the instances i1, i2, i3, and i4 may be merged. Then the resultant abutment layout of the instances i1, i2, i3, and i4 may include transistors and net connections but no dummy polysilicon shapes 403.

On executing of the abutment process by the control unit, the parameters of the instances i1, i2, i3, and i4 of the pcell are changed. The dummy polysilicon shapes 403 of the instances i1, i2, i3, and i4 are one example of the geometry of the pcells that is controlled by parameters of the instances i1, i2, i3, and i4. Each of the instances i1, i2, i3, and i4 of the pcell has one parameter that depicts the number of dummy polysilicon shapes 403 (left dummy polysilicon shapes) on left side of each of the instances i1, i2, i3, and i4, and there is another parameter that depicts the number of dummy polysilicon shapes 403 (right dummy polysilicon shapes) on right side of each of the instances i1, i2, i3, and i4. At stage 404, during the normal abutment protocol executed by the control unit, the PDK adjust the number of left-side dummy polysilicon shapes as well as the number of right-side dummy polysilicon shapes for each of the instances i1, i2, i3, and i4 when the instances i1, i2, i3, and i4 are chained.

At the end of the abutment process executed by the control unit, once the full chain is formed, a new chain event is called or generated by the control unit at stage 406 according to one embodiment of the present disclosure. In this implementation, the new chain event is read one time on the completed chain of abutted instances i1, i2, i3, and i4. At this time, no new instances will be added to the completed chain, and at the same time all the instances i1, i2, i3, and i4 in the chain are correctly positioned relative to each other. A PDK customizable abutment function which is a part of a PDK and residing in a memory unit is now invoked, specifying one or more instances of the completed chain i1, i2, i3, and i4 as one of its parameters, and an identifier representing the new chain event as the other argument. Within the PDK customizable abutment function code which handles the new chain post-processing event, one or more figures shapes may be created that may span several instances i1, i2, i3, and i4 of the chain. In the illustrated embodiment, a new top level shape may be created horizontally that may span several instances i1, i2, i3, and i4 of the chain. The new top level shape created is in the same design as the design containing the instances i1, i2, i3, and i4. The new top level shape created may be altered by the control unit. In one embodiment, the control unit may alter the shape and/or size of the new top level shape. Further, once the new chain event is called, the parameters of the instances i1, i2, i3, and i4 have been modified. The parameters may include various features including but not limited the simulation parameter which have been modified.

The parameters of the instances i1, i2, i3, and i4 are modified for multiple reasons. Firstly it has to be understood that there are two kinds of parameters associated with each of the instances i1, i2, i3, and i4 of the pcell. One of the parameters associated with each of the instances i1, i2, i3, and i4 of the pcell control the geometry. The geometry relates to the look of the pcell. Another parameter associated with each of the instances i1, i2, i3, and i4 of the pcell is dummy polysilicon shapes. There are multiple dummy polysilicon shapes 403 on both the left side and the right side of each of the four instances i1, i2, i3, and i4. These dummy polysilicon shapes 403 are part of the pcell instances i1, i2, i3, and i4 masters, and therefore the dummy polysilicon shapes 403 are within the pcell master. When the instances i1, i2, i3, and i4 gets abutted, the dummy polysilicon shapes 403 located on the left side and the right side of each of the instances i1, i2, i3, and i4 may be removed, because each of the instances i1, i2, i3, and i4 has got a neighbor now, and there is no requirement for as many dummy polysilicon shapes 403, since the dummy polysilicon shapes 403 of the neighbor is there for manufacturing reasons, and thus the dummy polysilicon shapes 403 can be removed. This is one reason for adjusting or modifying the parameters associated with each of the instances i1, i2, i3, and i4 during the abutment of the instances i1, i2, i3, and i4. In another embodiment, when the instances i1, i2, i3, and i4 gets abutted, the dummy polysilicon shapes 403 located on the left side and the right side of each of the instances i1, i2, i3, and i4 may be altered. In yet another embodiment, when the instance i1, i2, i3, and i4 gets abutted, additional dummy polysilicon shapes may be added.

Another reason for adjusting/modifying the parameters associated with each of the instances i1, i2, i3, and i4 during the abutment of the instances i1, i2, i3, and i4 is because of the simulation parameters. For example, when the value of the parameters of the instances i1, i2, i3, and i4 is changed, the pcell looks exactly the same. Since the parameters are provided for the simulation, based on the value of the parameters, the distance from where the gate is routed to where the fusion starts and finishes up the chain is known. The reason for that is because of the diffusion effects or the advanced node effects, the gate will behave differently depending on how far it is from the edge of the diffusion.

In accordance with all embodiments disclosed in the present disclosure, the arrangement of the instances of the pcell within the chain in the abutted relation to each other minimize both routing and space, while maintaining adherence to the design rules, constraints, and the netlist, may require at least one of the instances or several to be transformed. In forming an interconnected chain of instances, one or more such transformations may be required to be performed on the instances/chains to ensure that only compatible elements are mated.

In other embodiments, at the end of the abutment process executed by the control unit, once the full chain is formed, no new chain event is called or generated by the control unit at stage 406, and alternatively the control unit initiates the PDK customizable abutment function to allow the post-processing of the plurality of instances of the one or more programmable cells in the completed chain of abutted instances i1, i2, i3, and i4. In one setting, the PDK customizable abutment function also performs the abutment of the plurality of instances of the one or more programmable cells to form the completed chain of abutted instances i1, i2, i3, and i4. In another setting, the control unit initiates a new PDK customizable abutment function to allow the post-processing of the plurality of instances of the one or more programmable cells in the completed chain of abutted instances i1, i2, i3, and i4 wherein the new PDK customizable abutment function is different from the PDK customizable abutment function that performs the abutment of the plurality of instances of the one or more programmable cells to form the completed chain of abutted instances i1, i2, i3, and i4. In other words, the new PDK customizable abutment function is a separately registered function configured to perform the abutted chain post-processing.

Figure 5:
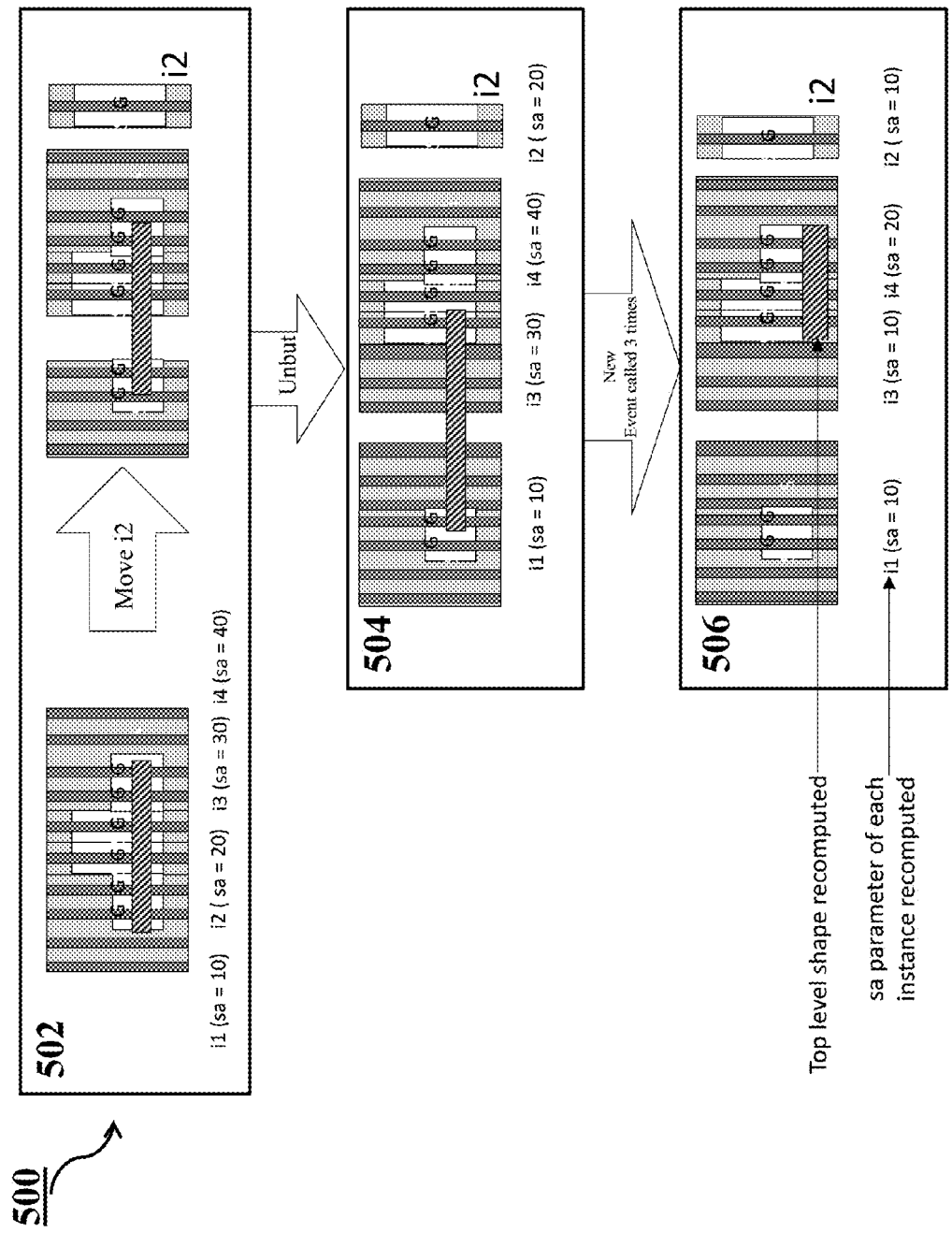
FIG. 5 illustrates unabutment process of an instance of a pcell from a chain of a plurality of instances of the pcell, resulting in three new chains, according to an exemplary embodiment.

FIG. 5 illustrates un-abutment process 500 of an instance of pcell from a chain of a plurality of instances of pcell, resulting in three new chains, according to an exemplary embodiment. In the EDA tool, if the user was required to insert one instance into a pre-existing chain of instances, an un-abutment tool executed by a control unit would need to first undo the abutment and break apart a first chain of instances. The un-abutting of the instances in this manner may require the regeneration of the instances that were shared during an abutment process. The un-abutment tool executed by the control unit will allocate space perhaps by shifting a portion of the instances, move the new instance within the broken first chain of instances, position the new instance appropriately, and recombine the first broken chain into combination with the new instance to form a new chain. The abutment tool executed by the control unit would then need to rearrange or transform one or both of the first chain and the new chain to comport with the netlist establishing the intended interconnections thereof.

Similarly, in the EDA tool, if the user was required to remove one instance from a pre-existing chain of instances, the abutment tool executed by the control unit would need to first undo an abutment and break apart the first chain of instances. The un-abutting of the instances in this manner may require the regeneration of the instances that were shared during the abutment process. The abutment tool executed by the control unit would then move the instance from the broken first chain of instances, and recombine the remaining instances in the first broken to form a new chain. The abutment tool executed by the control unit would then need to rearrange or transform the new chain to comport with the netlist establishing the intended interconnections thereof.

As embodied and illustrated in FIG. 5, there is a chain of instances i1, i2, i3, and i4 at stage 502. Each of the chain of instances i1, i2, i3, and i4 has an associated simulation parameter (sa) value which is equal to the distance from a left end of a continuous region of diffusion associated with the chained instances (chain of instances i1, i2, i3, and i4). The sa value for each of the instances in the chain (i1, i2, i3, and i4) is 10, 20, 30, and 40 respectively. The user triggers a command to move one instance i2 from a pre-existing chain of instances i1, i2, i3, and i4. The un-abutment tool executed by the control unit first un-abuts the moved instance i2 from its neighbors i1 and i3. At stage 504, the un-abutment tool executed by the control unit will un-abut the instance i2 from the broken first chain of instances. The abutment tool executed by the control unit will further rearrange or transform the new chain to comport with the netlist establishing the intended interconnections thereof. At stage 506, the un-abutment tool executed by the control unit will initiate a PDK customizable abutment updating function once per each of the resultant three chains (chain i1; chain i3, i4; and chain i2), and the PDK customizable abutment updating function will modify the value of the simulation parameters associated with the instances in each new chain depending on the latest position of the remaining instances relative to each other in the new chain. The PDK customizable abutment updating function code handling the new chain post-processing event will further remove and regenerate any top level shapes that had been created earlier by the same PDK customizable abutment updating function during chain post-processing after the original chain i1, i2, i3, i4 was formed.

Figure 6:
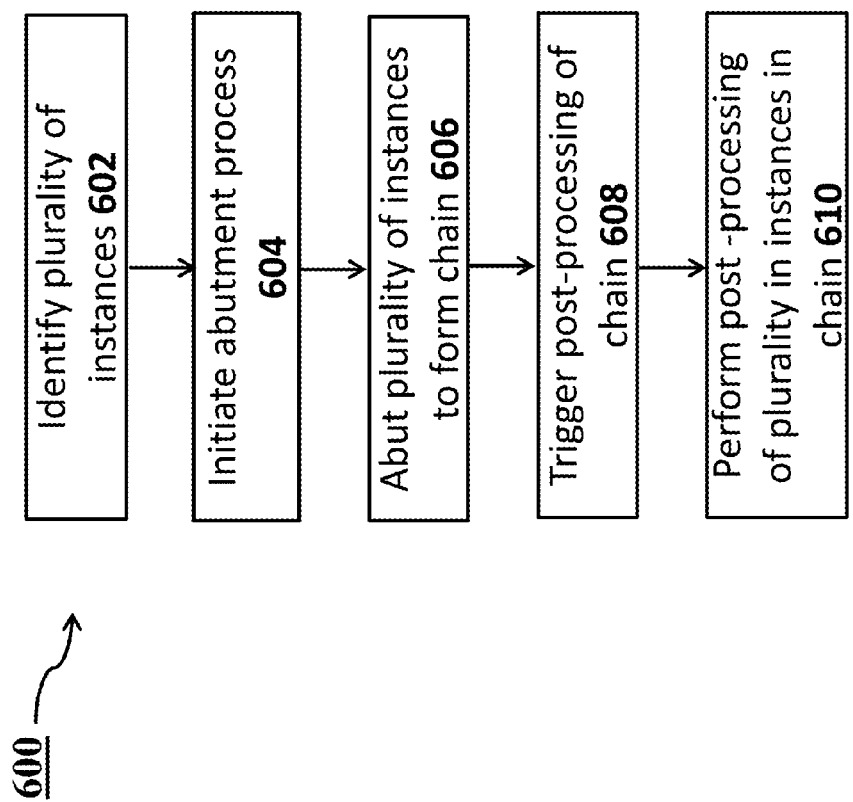
FIG. 6 is a flow diagram illustrating a method of abutment process of a plurality of instances of a pcell, according to an exemplary embodiment.

FIG. 6 is a flow diagram illustrating a method 600 of abutment process of a plurality of instances of a pcell, according to an exemplary embodiment. In an embodiment, a device such as a field effect transistor has a plurality of elements or portions including a gate, a drain, a source, contacts, wells, substrate, and the like. Depending upon the specific technology used, the portions may be different. In the case of bipolar junction transistor devices as opposed to field effect transistor devices the portions would include emitter, collector, and base. During the construction of logic gates it is generally beneficial to combine a plurality of transistors or other devices in a predetermined manner. This combination of devices may be accomplished by sharing elemental regions of devices, such as drain regions, source regions, or respective source and drain of devices together in an abutted relation. When the combination of the devices are arranged in the abutted relation, the two devices will overlap to a degree in at least partially superimposed relation and therefore no routing contacts may be necessary.

At step 602, a plurality of instances are identified for the abutment process by a control unit based on one or more identification rules. In one embodiment, the one or more identification rules relate to identifying overlapping or partially overlapping plurality of instances of the pcell. In another embodiment, the one or more identification rules relate to identifying the plurality of instances of the pcell placed within a pre-defined proximity to each other.

At step 604, the abutment process is initiated. In one embodiment, once the control unit identifies the plurality of instances of the pcell that are overlapping or partially overlapping to each other, the abutment process of the plurality of identified instances is executed by the control unit. In another embodiment, once the control unit identifies the plurality of instances of the pcell that are placed with the pre-defined proximity to each other, the abutment process of the plurality of identified instances is executed by the control unit. In yet another embodiment, the interactive abutment method may be initiated by the control unit. For example, when the circuit designer using the mouse-clicks in connection with the GUI move the plurality of instances that are touching to each other or are within the pre-defined proximity to each other into the complete overlapping or the partial overlapping position. The plurality of overlapping instances are then called abuttable figures which are within a current master of the plurality of the instances. In other words, when the circuit designer overlaps the plurality of instances such that the plurality of abuttable figures within their current masters are now overlapping each other. The abutment engine of the control unit will then detect if there is at least one edge overlap between the instances of the plurality of instances. Once the detection of the at least one edge being superimposed is determined, the abutment engine of the control unit initiates the abutment of the plurality of instances.

In yet another exemplary method of initiating the abutment process of the plurality of instances of the pcell, if there are plurality of instances that are not touching with each other, the circuit designer select the plurality of instances using the mouse-clicks in connection with the GUI but does not move the selected plurality of instances from their position within the design layout. The circuit designer subsequently invokes a chaining command in a control unit to chain the plurality of instances together. The chaining command initiates a chaining engine of the control unit to abut and chain the plurality of instances selected by the circuit designer. The chaining engine of the control unit then decides the order of the plurality of instances to be abutted, and produces the chain of abutted plurality of instances at step 606.

At step 608, at the end of the abutment process executed by the control unit, once the full chain is formed, the control unit triggers a post-processing of the plurality of instances of the one or more programmable cells in the abutted chain of the plurality of instances. In one embodiment, the triggering comprises generating by the control unit a new chain event after forming the abutted chain of the plurality of instances to allow the post-processing of the plurality of instances of the one or more programmable cells in the abutted chain. The new chain event is called as a new chain post-processing event in the present embodiment. In other words, the control unit initiates a PDK customizable abutment function to perform the abutted chain post-processing specifying the abutted chain of the plurality of instances to be post-processed. The control unit further specifies the event parameter as the new chain post-processing event. The new chain event is executed one time on the completed chain of abutted plurality of instances. In the illustrated embodiment, at this time, no new instances will be added to the completed chain, and at the same time, all the plurality of instances in the chain are correctly positioned relative to each other. In an embodiment, the position of the plurality of instances in the chain may be altered by the control unit. In another embodiment, the control unit may further execute post-processing of the plurality of instances in the chain.

In another embodiment, the triggering comprises initiating by the control unit a PDK customizable abutment function to allow the post-processing of the plurality of instances of the one or more programmable cells in the abutted chain. The PDK customizable abutment function also performs the abutment of the plurality of instances of the one or more programmable cells to form the abutted chain. In yet another embodiment, the triggering comprises initiating by the control unit, a new PDK customizable abutment function to allow the post-processing of the plurality of instances of the one or more programmable cells in the abutted chain. The new PDK customizable abutment function is different from a PDK customizable abutment function that performs the abutment of the plurality of instances of the one or more programmable cells to form the abutted chain. The new PDK customizable abutment function is a separately registered function configured to perform the abutted chain post-processing.

At step 610, post-processing of plurality in instances in the chain is performed. A PDK customizable abutment function which is a part of a PDK and residing in a memory unit is now invoked, specifying one or more instances of the completed chain as one of its parameters, and an identifier representing the new chain event as the other argument. Within the PDK customizable abutment function code which handles the new chain post-processing event, a new top level shape may be created horizontally that may span several instances of the completed chain. The new top level shape created is in the same design as the design containing the instances. The PDK customizable abutment function code for handling the new chain event may also modify the parameters of the pcell instances during the new chain processing event. The parameters may include various features including but not limited the simulation parameter which have been modified.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, etc. When a process corresponds to a function, its termination may correspond to a return of the function to the calling function or the main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the invention. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A processor-implemented method comprising:
identifying, by a processor in a database, a set of instances of a plurality of instances of one or more programmable cells for an abutment process, based on one or more identification rules, wherein the set of instances is configured to contain at least two instances;
abutting, by the processor, the identified set of instances of the plurality of instances of the one or more programmable cells to form one abutted chain of the identified set of instances of the plurality of instances, wherein the one abutted chain is configured to contain at least two instances; and
generating, by the processor in the database, a master shape comprising the identified set of instances of the plurality of instances of the one or more programmable cells in the one abutted chain of the identified set of instances of the plurality of instances, wherein the master shave contains a set of parameters for the one abutted chain such that a modification to the set of parameters updates parameters of the instances within the one abutted chain.

2. The processor-implemented method of claim 1, further comprising generating, by the processor, a new chain event after forming abutted chain of the identified set of instances of the plurality of instances to allow post-processing of the identified set of instances of the plurality of instances of the one or more programmable cells in the abutted chain.

3. The processor-implemented method of claim 1, wherein the generating comprises initiating, by the processor, a process design kit (PDK) customizable abutment function to allow post-processing of the identified set of instances of the plurality of instances of the one or more programmable cells in the abutted chain wherein the PDK customizable abutment function performs the abutment of the identified set of instances of the plurality of instances of the one or more programmable cells to form the abutted chain.

4. The processor-implemented method of claim 1, wherein the generating comprises initiating, by the processor, a new PDK customizable abutment function to allow post-processing of the identified set of instances of the plurality of instances of the one or more programmable cells in the abutted chain, wherein the new PDK customizable abutment function is different from a PDK customizable abutment function that performs the abutment of the identified set of instances of the plurality of instances of the one or more programmable cells to form the abutted chain.

5. The processor-implemented method of claim 1, wherein the one or more identification rules relate to identifying overlapping or partially overlapping the set of instances of the plurality of instances of the one or more programmable cells.

6. The processor-implemented method of claim 1, wherein the one or more identification rules relate to identifying the set of instances of the plurality of instances of the one or more programmable cells placed within a pre-defined proximity to each other.

7. The processor-implemented method of claim 1, further comprising receiving, by the processor, a chaining command to initiate the abutment process of a user selected subset of the set of instances of the plurality of instances of the one or more programmable cells.

8. The processor-implemented method of claim 1, wherein each of the identified set of instances of the plurality of instances of the one or more programmable cells is associated with a set of parameter values, and wherein each group of the plurality of instances of the one or more programmable cells which have the same parameter values bind to a same programmable cell sub-master.

9. The processor-implemented method of claim 1, further comprising modifying, by the processor, a set of parameters values of the plurality of instances of the one or more programmable cells.

10. The processor-implemented method of claim 1, further comprising creating or adjusting, by the processor, one or more figures shapes or other instances in a cell view of the abutted chain of the set of instances of the plurality of instances of the one or more programmable cells.

11. The processor-implemented method of claim 1, further comprising removing, by the processor, one or more dummy polysilicon shapes abutting the one or more programmable cells.

12. The processor-implemented method of claim 1, further comprising storing, by the processor, the abutted chain of the set of instances of the plurality of instances of the one or more programmable cells in a non-transitory machine-readable memory unit.

13. The processor-implemented method of claim 1, further comprising:
receiving, by the processor, an instruction to un-abut at least one instance from the abutted chain of the set of instances of the plurality of instances of the one or more programmable cells;
in response to receiving the instruction, un-abutting, by the processor, the at least one instance from the abutted chain of the set of instances of the plurality of instances of the one or more programmable cells to form one or more new chains; and
triggering, by the processor, post-processing of each of the one or more new chains to allow the post-processing of remaining plurality of instances of the one or more pcells in the one or more new chains, wherein the triggering comprises either generating a new event or initiating a PDK customizable abutment updating function each time per each resulting new chain after forming the one or more new chains to allow the post-processing of the remaining plurality of instances of the one or more pcells in the one or more new chains.

14. An electronic design automation system comprising:
a non-transitory machine-readable memory unit to store one or more identification rules; and
a control unit comprising a processor configured to identify a set of instances of a plurality of instances of one or more programmable cells for an abutment process based on the one or more identification rules wherein the set of instances is configured to contain at least two instances, initiate the abutment process of the identified set of instances of the plurality of instances of the one or more programmable cells to form one abutted chain of the identified set of instances of the plurality of instances wherein the one abutted chain is configured to contain at least two instances, and generate a master shape comprising the identified set of instances of the plurality of instances of the one or more programmable cells in the one abutted chain of the identified set of instances of the plurality of instances, wherein the master shape contains a set of parameters for the one abutted chain such that a modification to the set of parameters updates parameters of the instances within the one abutted chain.

15. The electronic design automation system of claim 14, wherein the processor is further configured to generate a new chain event after forming the abutted chain of the identified set of instances of the plurality of instances to allow post-processing of the identified set of instances of the plurality of instances of the one or more programmable cells in the abutted chain.

16. The electronic design automation system of claim 14, wherein the processor is further configured to initiate a PDK customizable abutment function to allow post-processing of the identified set of instances of the plurality of instances of the one or more programmable cells in the abutted chain, wherein the PDK customizable abutment function also performs the abutment of the identified set of instances of the plurality of instances of the one or more programmable cells to form the abutted chain.

17. The electronic design automation system of claim 14, wherein the processor is further configured to initiate a new PDK customizable abutment function to allow the post-processing of the identified set of instances of the plurality of instances of the one or more programmable cells in the abutted chain, wherein the new PDK customizable abutment function is different from a PDK customizable abutment function that performs the abutment of the identified set of instances of the plurality of instances of the one or more programmable cells to form the abutted chain.

18. The electronic design automation system of claim 15, wherein no more instances of the one or more programmable cells are added into the abutted chain after the post-processing is triggered.

19. The electronic design automation system of claim 15, wherein the identified set of instances of the plurality of instances of the one or more programmable cells are correctly positioned relative to each other when the new chain event is generated.

20. The electronic design automation system of claim 14, wherein upon receiving an instruction to un-abut at least one instance from the abutted chain of the set of instances of the plurality of instances of the one or more programmable cells, the control unit is configured to un-abut the at least one instance from the abutted chain of the set of instances of the plurality of instances of the one or more programmable cells to form one or more new chains; and trigger post-processing of each of the one or more new chains to allow the post-processing of remaining plurality of instances of the one or more pcells in the one or more new chains, wherein the trigger comprises either generating a new event or initiating a PDK customizable abutment updating function each time per each resulting new chain after forming the one or more new chains to allow the post-processing of the remaining plurality of instances of the one or more pcells in the one or more new chains.

* * * * *